United States Patent
Schaefer

(10) Patent No.: US 8,321,719 B2
(45) Date of Patent: Nov. 27, 2012

(54) EFFICIENT CLOCKING SCHEME FOR A BIDIRECTIONAL DATA LINK

(75) Inventor: Andre Schaefer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 426 days.

(21) Appl. No.: 12/567,701

(22) Filed: Sep. 25, 2009

(65) Prior Publication Data

US 2011/0078368 A1   Mar. 31, 2011

(51) Int. Cl.
*G06F 1/04* (2006.01)
*G06F 1/12* (2006.01)
*G06F 5/06* (2006.01)

(52) U.S. Cl. ........ 713/600; 713/400; 713/500; 711/100; 711/104; 711/105; 710/58; 710/61

(58) Field of Classification Search ................. 713/400, 713/500, 600; 711/100, 104, 105; 710/58, 710/61
See application file for complete search history.

(56) References Cited

U.S. PATENT DOCUMENTS

| | | | |
|---|---|---|---|
| 5,479,647 A | 12/1995 | Harness et al. | |
| 5,987,576 A | 11/1999 | Johnson et al. | |
| 6,002,638 A | 12/1999 | John | |
| 6,209,072 B1 | 3/2001 | MacWilliams et al. | |
| 6,516,362 B1* | 2/2003 | Magro et al. | 710/58 |
| 6,839,393 B1* | 1/2005 | Sidiropoulos | 375/371 |
| 7,042,914 B2* | 5/2006 | Zerbe et al. | 370/516 |
| 7,478,259 B2* | 1/2009 | Ferraiolo et al. | 713/501 |
| 7,487,378 B2* | 2/2009 | Morein et al. | 713/503 |
| 7,581,131 B1* | 8/2009 | Prasad et al. | 713/401 |
| 7,673,080 B1* | 3/2010 | Yu et al. | 710/62 |
| 2002/0129215 A1 | 9/2002 | Yoo et al. | |
| 2003/0075609 A1* | 4/2003 | Kim | 235/492 |
| 2005/0169417 A1* | 8/2005 | Amirichimeh et al. | 375/371 |
| 2006/0067156 A1 | 3/2006 | Ruckerbauer et al. | |

OTHER PUBLICATIONS

Office Action for United Kingdom Patent Application No. 1015448.2, (Nov. 29, 2011), Whole Document.
Office Action for United Kingdom Patent Application No. 1015448.2, (Dec. 17, 2010), Whole Document.

* cited by examiner

*Primary Examiner* — Jaweed A Abbaszadeh
(74) *Attorney, Agent, or Firm* — Blakely, Sokoloff, Taylor & Zafman LLP

(57) ABSTRACT

A method for communication via a bidirectional data link between a processing device and a memory device. The memory device includes a clock source to generate a clock signal for driving a latching at the memory device of data to and/or from the bidirectional data link. The memory device provides the clock signal to the processing device for driving a latching at the processing device of data to and/or from the bidirectional data link.

15 Claims, 6 Drawing Sheets

500

510
Exchanging a first clock signal from a first interface for a memory device to a second interface for a processing unit

520
Performing a latching of data by the second interface based on the exchanged first clock signal

530
Exchanging data between the first interface and the second interface in response to the latching

EFFICIENT CLOCKING SCHEME FOR A BIDIRECTIONAL DATA LINK

BACKGROUND

1. Technical Field

Embodiments of the present invention relate generally to data communication techniques. More particularly, embodiments relate to techniques for clocking data exchanges on a bidirectional data link between two interfaces.

2. Background Art

FIG. 1 illustrates a system 100 according to existing techniques for bidirectional package-to-package data communications between a processing device 102 and a memory device—e.g. a random access memory (RAM) 152. A processing interface 104 of processing device 102 coordinates a buffering of data for exchanging to/from processing unit 102—e.g. via a receive first-in-first-out (FIFO) buffer Rx FIFO 120 and/or a transmit buffer Tx FIFO 110. Processing interface 104 may, for example, include an analog front end of processing device 102. A RAM interface 150 coordinates data exchanges on behalf of RAM 152.

Processing interface 104 for processing unit 102 may include a transmit latch 114 in a transmit path 112 to carry data from Tx FIFO 110 to a bidirectional link DQ 140, while RAM interface 150 for RAM 152 may include a receive latch 164 in a receive path 162 to carry data from DQ 140 to RAM 152. A writing of data to RAM 152 by processing unit 102 may include clocked latching by transmit latch 114 and receive latch 164. In a corresponding manner, RAM interface 150 includes a transmit latch 174 in a transmit path 172 to carry data from RAM 152 to DQ 140, while processing interface 104 includes a receive latch 124 in a receive path 122 to carry data from DQ 140 to Rx FIFO 120. A reading of data in RAM 152 by processing unit 102 includes clocked latching by transmit latch 174 and receive latch 124.

To clock the latching of data to/from DQ 140, a clock source 130 circuit of processing interface 104 generates a clock signal $CLK_W$ 142—e.g. based on a received reference clock signal $CLK_{Ref}$ 135. In addition to driving clocked latching of transmit latch 114 and receive latch 124, $CLK_W$ 142 is also provided to RAM interface 150 for clocked latching of data in receive latch 164 to RAM 152 and/or for clocked latching of data in transmit latch 174 to DQ 140. In receiving $CLK_W$ 142 from processing interface 104, RAM interface 150 needs to include signal recovery circuitry—e.g. a clean-up circuit 180—to filter noise components from $CLK_W$ 142 which are introduced by being generated at and/or transmitted from processing interface 104.

For clocking synchronization, existing clocking designs physically locate as clock source 130 in a central position of processing device 102 in order to provide shorter clock/phase distribution through a clock tree of the processor. Consequently, existing data processing techniques rely upon the 'processor side' of system 100 to provide to the 'memory side' a clock signal from the processor side clock source for coordinating the memory side latching of data to and/or from DQ 140. This reliance on a processor interface to provide a clock signal to a memory device interface comes at a premium at least insofar as it consumes valuable substrate surface area on the processor side.

BRIEF DESCRIPTION OF THE DRAWINGS

The various embodiments of the present invention are illustrated by way of example, and not by way of limitation, in the figures of the accompanying drawings and in which.

DETAILED DESCRIPTION

As discussed herein, certain embodiments provide an efficient clocking scheme for latching data of a bidirectional data link between two integrated circuit (IC) packages. A first IC package may include a first interface for one or more memory devices, and a second IC package may include a second interface for a processing device configured to access the one or more memory devices via a bidirectional data link between the first and second interfaces. The first IC package may include a clock source to generate a clock signal for latching data to and/or from the bidirectional data link. The clock source may include a phase-locked loop (PLL) circuit, for example.

In certain embodiments, the first interface may use the clock signal generated by the clock source to latch data which is inbound to the first IC package on the bidirectional data link. Alternatively or in addition, the clock signal generated by the clock source may be sent from the first IC package to the second IC package. The second interface may perform a latching of data to and/or from the bidirectional data link in response to receiving the clock signal from the first IC package. For example, the second interface may use the received clock signal (or a derivate thereof) to latch incoming data and/or to retime the latching of outgoing data.

Figure 1:
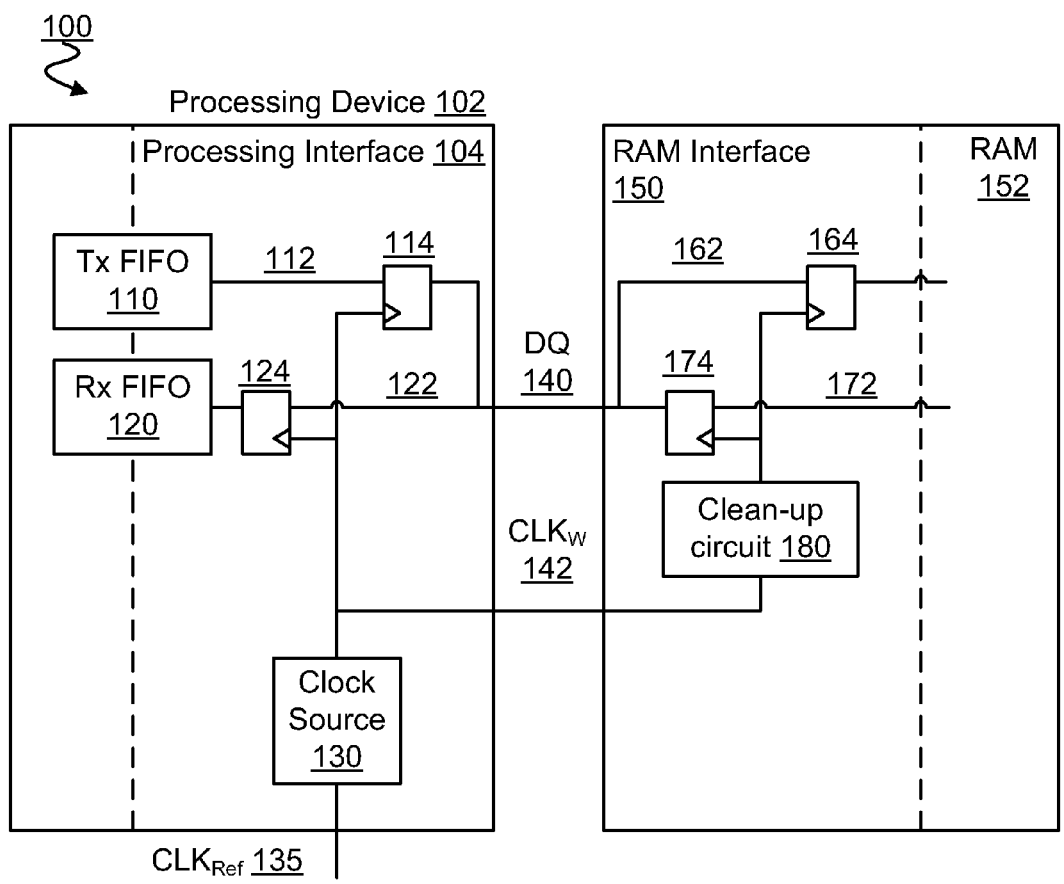
FIG. 1 is a block diagram illustrating elements of a system implementing previous techniques for a latching of a bidirectional data link.
Figure 2:
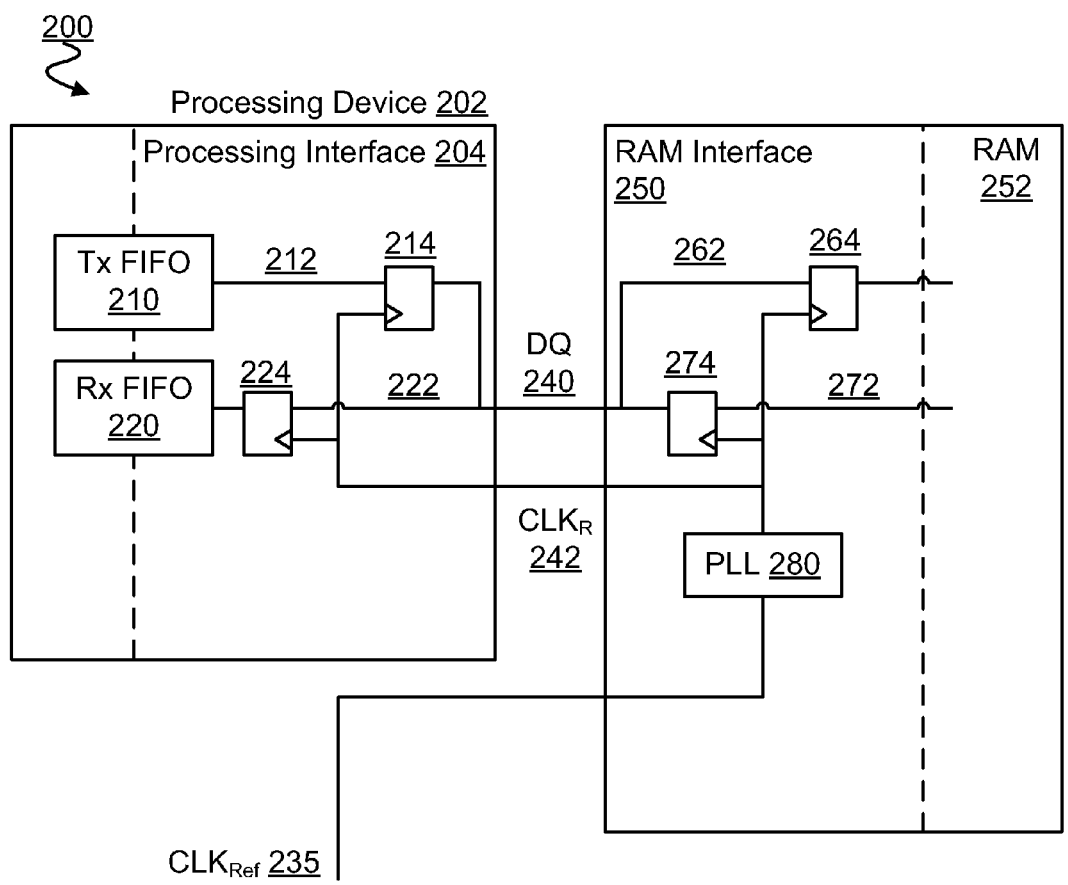
FIG. 2 is a block diagram illustrating elements of a system implementing clocked latching of a bidirectional data link according to an embodiment.

FIG. 2 illustrates select elements of a system 200 to implement a clocking scheme according to an embodiment. System 200 may include a processing device 202 having a processing interface 204 by which processing device 202 exchanges data with one or more memory devices. Processing device 202 may include any of a variety of devices—e.g. a central processing unit (CPU), a graphical processing unit (GPU), a controller, etc.—which implement data processing and exchange data on one or more data links for said processing. In various embodiments, processing device 202 may include one or more processing cores (not shown). Processing interface 204 may, for example, include an analog front end of processing device 202.

The one or more memory devices with which processing device 202 exchanges data may include a random access memory (RAM) 252 of system 200. RAM 252 may comprise any of a variety of combinations of RAM devices including, but not limited to, a dynamic RAM (DRAM), a static RAM (SRAM), a synchronous graphics RAM (SGRAM), etc. Processing interface 204 may exchange data with RAM 252 via a RAM interface 250, for example. In an embodiment, RAM interface 250 may be integral to RAM 252. Alternatively or in addition, RAM interface 250 may be separate from one or more memory devices—e.g. wherein RAM interface 250 is a common interface for processing device 202 to exchange data with multiple separate memory devices.

As illustrated in FIG. 2, a bidirectional data line DQ 240 between processing interface 204 and RAM interface 250 may exchange read and/or write data for processing device 202 and RAM 252. Processing interface 204 may coordinate the receiving of inbound data—and/or the sending of outbound data—on DQ 240 on behalf of processing device 202. By way of illustration and not limitation, processing interface 204 may comprise a transmit path 212 including a transmit latch 214 to carry data from a transmit buffer Tx FIFO 210 to a bidirectional link DQ 240. Alternatively or in addition, processing interface 204 may comprise a receive path 222 including a receive latch 224 to carry data from DQ 240 to a receive buffer Rx FIFO 220. Tx FIFO 210 and Rx FIFO 220 may variously buffer data to be exchanged between processing interface 204 and other elements of processing device 202. For example, Tx FIFO 210 and Rx FIFO 220 may, respectively, receive data from and send data to an uncore section of processing device 202 for later data processing. As used herein, 'uncore' refers to a portion of a processing device which provides operations in support of processor core(s), but is not actually part of the processing core(s).

RAM interface 250 may comprise a receive path 262 including a receive latch 264 to carry data from DQ 240 to RAM 252. Alternatively or in addition, RAM interface 250 may comprise a transmit path 272 including a transmit latch 274 to carry data from RAM 252 to DQ 240. Exchanging data with RAM 252 may include receive path 262 sending data to—and/or transmit path 272 receiving data from—any of a variety of combinations of buffers, buses or other data communication means (not shown) within RAM 252.

A writing of data to RAM 252 by processing unit 202 may include clocked latching by transmit latch 214 and receive latch 264. Alternatively or in addition, a reading of data from RAM 252 by processing unit 202 may include clocked latching by transmit latch 274 and receive latch 224. The clocked latching of various latches of processing interface 204 and RAM interface 250 may be coordinated by a clock signal generated by a clock source within RAM interface 250. For example, RAM interface 250 may include a PLL 280 to generate a clock signal $CLK_R$ 242—e.g. from a received reference clock signal $CLK_{Ref}$ 235.

In an embodiment, $CLK_R$ 242 may be provided to various latches of RAM interface 250. Alternatively or in addition, $CLK_R$ 242 may be provided from RAM interface 250 to processing interface 204—e.g. to coordinate the latching of data in either or both of transmit path 212 and receive path 222. The locating of the PLL 280 in the RAM interface 250 enables improved application of the respective technological strengths of the processing device 202 and the RAM interface 250. RAM technologies are frequently designed to provide comparatively high data rate topologies. For example, DRAM technologies may provide isolated wells in their physical stack, which aids in designing a low noise PLL 280 supporting high data rates. Moreover, the physical layer of processors often show relatively low clock flight times per silicon trace length and lower supply noise susceptibility. Therefore it is comparatively easy for processing device 202 to tolerate an incoming clock signal from an external clock source—e.g. PLL 280. The benefits of PLL 280 providing a low noise $CLK_R$ 242 to a noise tolerant processing device 202 allow processing interface 204 to forego not only certain clock source circuitry, but also clean-up circuitry to remove noise from the received $CLK_R$ 242. In an embodiment, processing interface 204 and RAM interface 250 may be positioned so that, in order to promote sufficient tolerance of any noise in $CLK_R$ 242, the length of link DQ 240 is substantially at or below three (3) inches.

Traditional clocking schemes have been designed on the assumption that the 'processor side' of a system—processing device 102 of system 100, for example—must include a clock source 130 both for driving internal processor device latching and for driving latching of the 'memory side' of such a system. More particularly, these existing clocking designs physically locate as clock source 130 in a central position of processing device 102 in order to provide shorter clock/phase distribution through a clock tree of the processor. The central positioning of clock source 130—e.g. within a processing core of processing device 102—has previously been relied upon for desirable clocktree characteristics such as a low jitter during low power operation.

Figure 3:
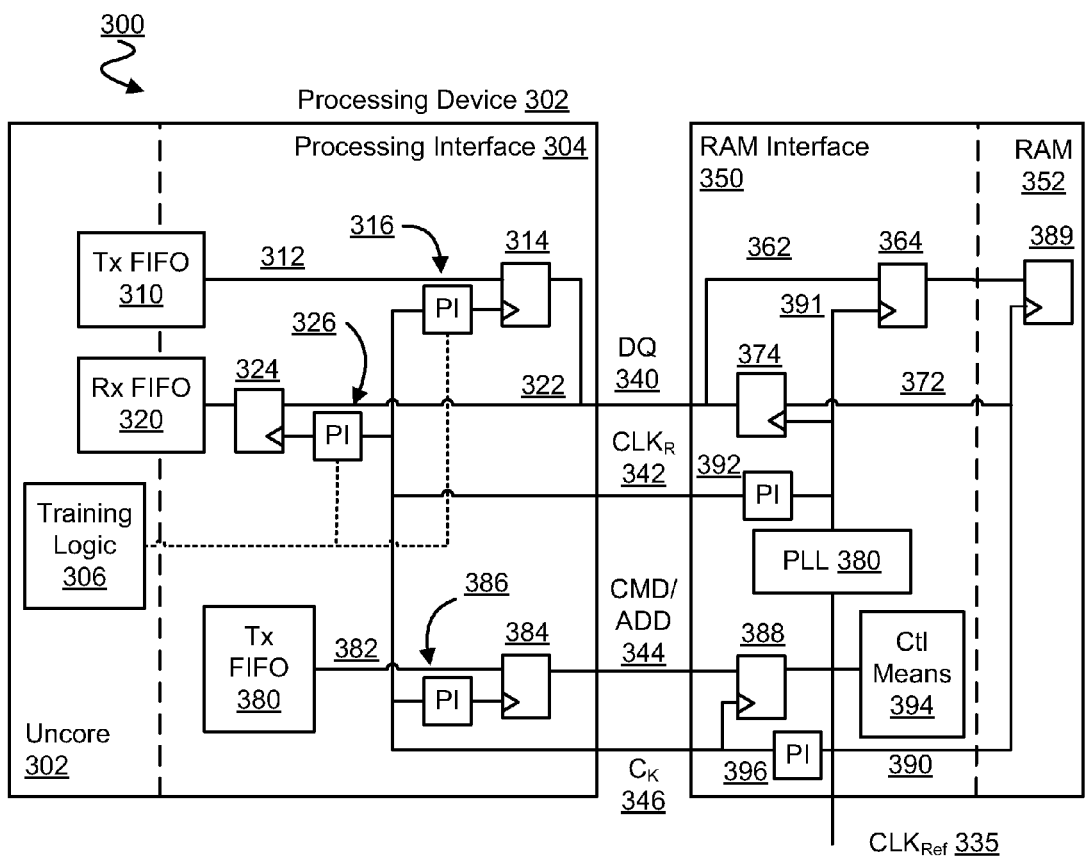
FIG. 3 is a block diagram illustrating elements of a system implementing clocked latching according to an embodiment.

FIG. 3 illustrates select elements of a system 300 to implement a clocking scheme according to an embodiment. System 300 may include one or more features described herein with respect to system 200. A processing device 302 of system 300 may include a processing interface 304 to exchange data with one or more memory devices—e.g. RAM 352. Processing interface 304 may exchange data with RAM 352 via a RAM interface 350, wherein a bidirectional data link DQ 340 between processing interface 304 and RAM interface 350 carries the exchanged data. Processing interface 304 may comprise a transmit path 312 including a transmit latch 314 to carry data from a transmit buffer Tx FIFO 310 to DQ 340, and a receive path 322 including a receive latch 324 to carry data from DQ 340 to a receive buffer Rx FIFO 320. Tx FIFO 310 and Rx FIFO 320 may variously buffer data to be exchanged between processing interface 304 and other elements of processing device 302—e.g. an uncore 302.

RAM interface 350 may comprise a receive latch 364 in a receive path 362 to carry data from DQ 340 to RAM 352 and/or a transmit latch 374 in a transmit path 372 to carry data from RAM 352 to DQ 340. Processing device 302 may variously read from or write to RAM 352 via operations governed by clocked latching of the various transmit/receive latches. The clocked latching of various latches of processing interface 304 and RAM interface 350 may be coordinated by a clock signal $CLK_R$ 342 generated from a reference clock signal $CLK_{Ref}$ 335 by a clock source PLL 380 at RAM interface 350. $CLK_R$ 342 may be provided to processing interface 304 to coordinate the latching of data in either or both of transmit path 312 and receive path 322.

System 300 may further include means for controlling the clocking phase across the various latches of processing interface 304. In an embodiment, processing interface 304 may include phase interpolators 316, 326 and 386 associated with respective latches 314, 324 and 384. Each phase interpolator (PI) may include circuitry to adjust a phase delay of the signal $CLK_R$ 342 (or a derivative thereof) just before the $CLK_R$ 342 is variously input to drive the respective latches 314, 324 and 384. The adjusting of phase by various PIs may be controlled by training logic 306 of processing device 302.

In an embodiment, latch 384 may latch data to a link CMD/ADD 344 further coupling processing interface 304 and RAM interface 350. For example, latch 384 may latch to CMD/ADD 344 additional information—e.g. command and/or address information—associated with read and/or write data exchanged via DQ 340. RAM interface 350 may include a corresponding latch 388 to receive the information on CMD/ADD 344. For example, information may be latched though latch 388 to control means 394 of the RAM interface 350 which determine addressing of data reads/writes by RAM 352. Latching of data in CMD/ADD 344 by latch 384 and/or latch 388 may be synchronized with a clock $C_K$ 346—e.g. a derivative of $CLK_R$ 342. The clock signal $C_K$ 346 may also be provided to other latching circuitry in RAM 352 itself, as illustrated by a signal 390 driving a latch 389 of RAM 352.

RAM interface 350 may include any of a variety of combinations of phase interpolators—e.g. one or more of PIs 392, 396—to perform phase adjustment on the memory side of system 300. RAM interface 350 may further include additional training/tracking logic—e.g. in control means 394—to monitor and/or direct phase adjustments for latches in RAM interface 350. Locating PIs proximate to the clock source—e.g. in RAM interface 350 with PLL 380—enables a relatively faster thermal drift compensation for clocking of command/address exchanges. Moreover, offloading at least some phase tracking and/or training from the processing device 302 may simplify the adjusting required by processing device 302 as it variously transitions in between power states. This may allow for faster, more power efficient transitions to/from sleep states by processing device 302.

Figure 4:
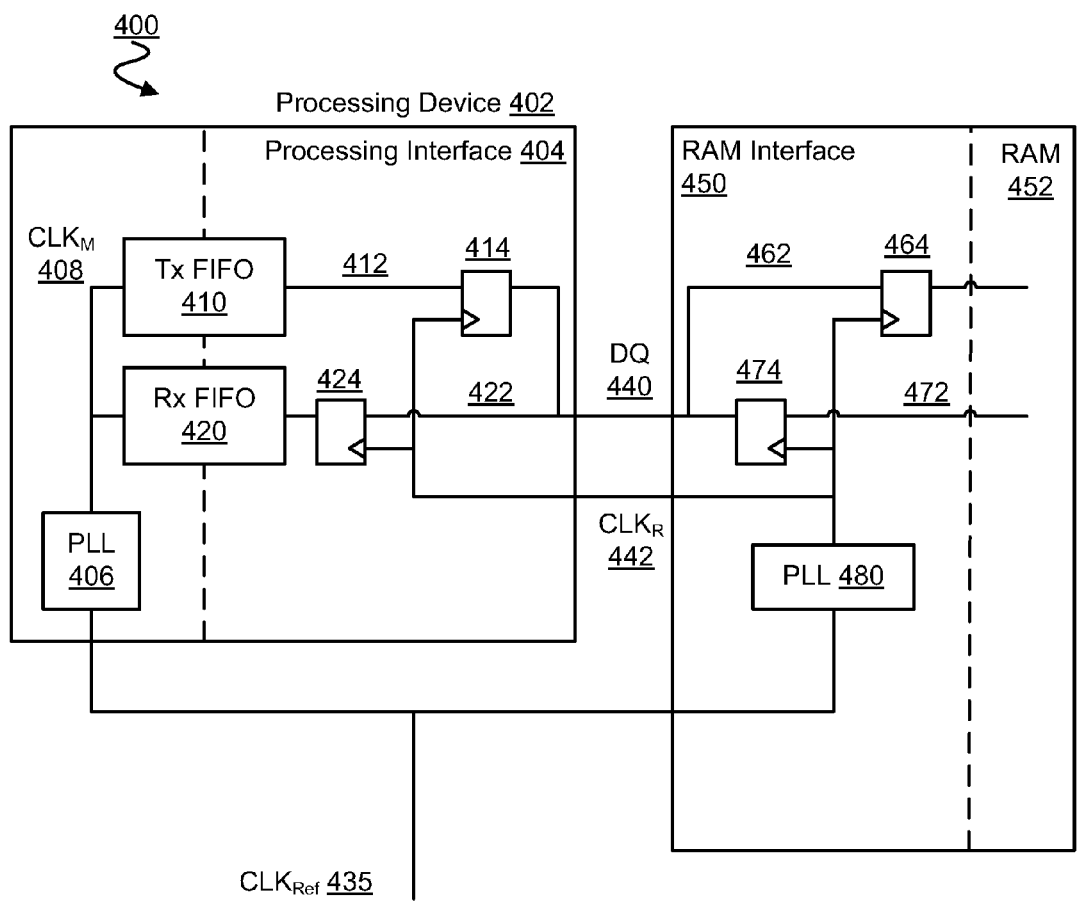
FIG. 4 is a block diagram illustrating elements of a system implementing clocked latching according to an embodiment.

FIG. 4 illustrates select elements of a system 400 to implement a clocking scheme according to an embodiment. System 400 may include one or more features described herein with respect to systems 200 and 300. A processing device 402 of system 400 may include a processing interface 404 to exchange data with one or more memory devices—e.g. RAM 452. Processing interface 404 may exchange data with RAM 452 via a RAM interface 450, wherein a bidirectional data link DQ 440 between processing interface 404 and RAM interface 450 carries the exchanged data. Processing interface 404 may comprise a transmit path 412 including a transmit latch 414 to carry data from a transmit buffer Tx FIFO 410 to DQ 440, and a receive path 422 including a receive latch 424 to carry data from DQ 440 to a receive buffer Rx FIFO 420. Tx FIFO 410 and Rx FIFO 420 may variously buffer data to be exchanged between processing interface 404 and other elements of processing device 402.

RAM interface 450 may comprise a receive latch 464 in a receive path 462 to carry data from DQ 440 to RAM 452 and/or a transmit latch 474 in a transmit path 472 to carry data from RAM 452 to DQ 440. Processing device 402 may variously read from or write to RAM 452 via operations governed by clocked latching of the various transmit/receive latches. The clocked latching of various latches of processing interface 404 and RAM interface 450 may be coordinated by a clock signal $CLK_R$ 442 generated from a reference clock signal $CLK_{Ref}$ 435 by a clock source PLL 480 at RAM interface 450. $CLK_R$ 442 may be provided to processing interface 404 to coordinate the latching of data in either or both of transmit path 412 and receive path 422.

The PLL 480 may generate $CLK_R$ 442 from a reference signal $CLK_{Ref}$ 435. In an embodiment, the same $CLK_{Ref}$ 435 may also be provided directly to processing device 402 for driving elements thereof. For example, $CLK_{Ref}$ 435 may be provided to a PLL 406 of processing device 402, which generates a master clock signal $CLK_M$ 408 to drive one or more of Tx FIFO 410 and Rx FIFO 420. In an embodiment, either or both of PLL 480 and PLL 406 may operate as a clock source by variously applying frequency multiplication and/or frequency division to $CLK_{Ref}$ 435.

Figure 5:
FIG. 5 is a sequence diagram illustrating elements of an algorithm for latching a bidirectional data link according to an embodiment.

FIG. 5 illustrates select elements of a method 500 for a clocking scheme according to various embodiments. Method 500 may be performed by system 200, for example. Method 500 may include exchanging, at 510, a first clock signal from a first interface for a memory device to a second interface for a processing unit. Based on the exchanged first clock signal, a latching of data may be performed by the second interface, at 520. In response to the latching, data may be exchanged, at 530, between the first interface and the second interface.

Figure 6:
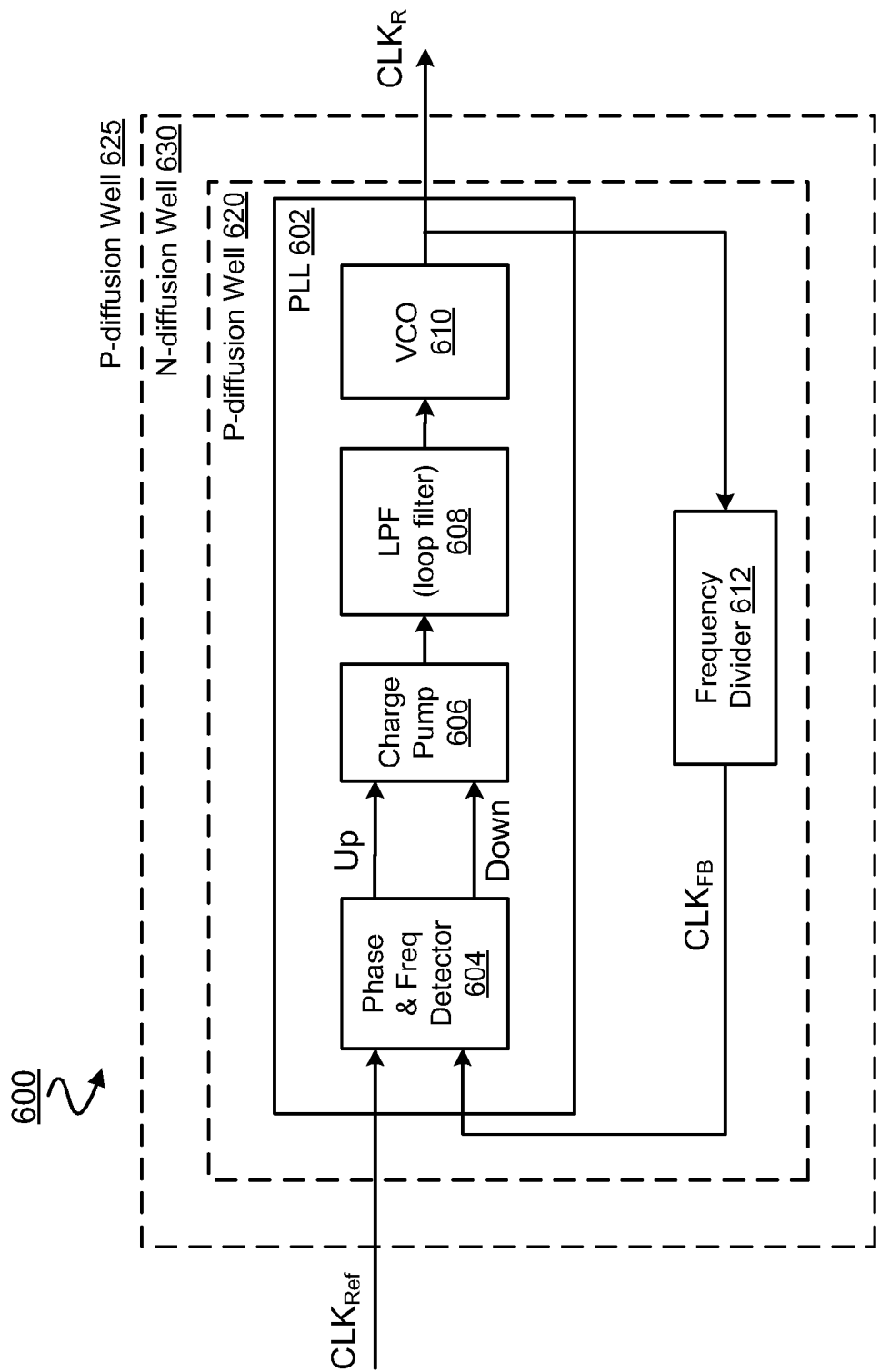
FIG. 6 is a block diagram illustrating a clock source according to an embodiment.

FIG. 6 illustrates select elements of a clock source 600 according to an embodiment, which may include a PLL 602. Clock source 600 may represent features in one or more of PLL 280, PLL 380 and PLL 480, for example. A frequency divider 612 may be coupled to the PLL 602. The PLL 602 may include a phase and frequency detector 604. A charge pump 606 is coupled to the phase and frequency detector 604. A loop filter (LPF) 608 is coupled to the charge pump 606. A voltage-controlled oscillator (VCO) 610 is coupled to the LPF 608.

Phase and frequency detector 604 may compare the frequencies of two signals $CLK_{Ref}$ and $CLK_{FB}$ and produce an Up (or Down) signal proportional to the difference between the input frequencies. The error signal is then low-pass filtered by LPF 608 and used to drive VCO 610, which generates an output signal $CLK_R$. The output signal $CLK_R$ is fed through a frequency divider 612 back to the input of Phase and frequency detector 604, producing a negative feedback loop. If the output frequency drifts, the error signal will increase, driving the VCO 610 to output a frequency in the opposite direction so as to reduce the error.

Clock source 600 may reside on a substrate with other components which may serve as sources of electromagnetic noise in the output signal $CLK_R$. In order to reduce the contribution of such noise, some or all components of clock source 600 may be located in an isolated well. For example, PLL 602 may be located in a P-diffusion well 620 in a substrate which is surrounded by an N-diffusion well 630 of the substrate. N-diffusion well 630 may serve as a barrier to other high frequency EM noise components which may be generated by other components—e.g. in an outlying P-diffusion well 625. Noise shielding may further include applying a voltage $V_{CC}$ to the N-diffusion well 630 and/or grounding one or more of P-diffusion wells 620, 625. In embodiments where this noise protection is provided, clock source 600 may be located at a RAM interface and provide $CLK_R$ to a processor interface in a separate IC package.

Techniques and architectures for data communication are described herein. In the above description, for purposes of explanation, numerous specific details are set forth in order to provide a thorough understanding of embodiments of the invention. It will be apparent, however, to one skilled in the art that embodiments of the invention can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed descriptions which follow are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems is described herein. In addition, embodiments of the invention are not described with reference to any particular programming language. It will be appreciated that a variety of programming languages may be used to implement the teachings of embodiments of the invention as described herein.

Besides what is described herein, various modifications may be made to the disclosed embodiments and implementations of the invention without departing from their scope. Therefore, the illustrations and examples herein should be construed in an illustrative, and not a restrictive sense. The scope of embodiments of the invention should be measured solely by reference to the claims that follow.

What is claimed is:

1. A method comprising:
   exchanging a first clock signal from a first interface of a memory device to a second interface of a processing unit, the first clock signal generated by a phase-locked loop (PLL) of the first interface based on a reference clock signal provided to the memory device independent of the processing unit, wherein the second interface is an analog front end of the processing unit;
   wherein a first latching and a second latching are each performed at the second interface based on the exchanged first clock signal; and
   wherein the first latching for the processing unit to read data from the memory device via a bidirectional data link coupled directly to the first interface and further coupled directly to the second interface, and wherein the second latching is for the processing unit to write data to the memory device via the bidirectional data link.

2. The method of claim 1, wherein the first interface is an analog front end of the memory device.

3. The method of claim 1, wherein the memory device is one of a plurality of memory devices and wherein the first interface interfaces each of the plurality of memory devices with the processing unit.

4. The method of claim 1, wherein the memory device includes one of a dynamic random access memory (RAM) and a static RAM.

5. The method of claim 1, wherein the memory device includes a synchronous random access memory (RAM).

6. The method of claim 1, wherein the memory device includes a graphics random access memory (RAM).

7. The method of claim 1, wherein the memory device includes a Graphics Double Data Rate (GDDR) memory device.

8. The method of claim 1, wherein the processing unit includes a graphics processing unit.

9. The method of claim 1, further comprising providing the reference clock signal to both the processing unit and the first interface.

10. An apparatus comprising:
    a memory device including:
      a first interface to couple directly to a bidirectional data link coupled directly to a second interface of a processing unit, wherein the second interface is an analog front end of the processing unit; and
      a clock source comprising a phase-locked loop (PLL) to generate a first clock signal based on a reference clock signal provided to the memory device independent of the processing unit;
   wherein the first interface provides the first clock signal to the second interface, wherein a first latching and a second latching are each performed at the second interface based on the provided first clock signal, wherein the first latching for the processing unit to read data from the memory device via a bidirectional data link, and wherein the second latching is for the processing unit to write data to the memory device via the bidirectional data link.

11. The apparatus of claim 10, wherein the first interface is an analog front end of the memory device.

12. The apparatus of claim 10, wherein the memory device includes one of a dynamic random access memory (RAM) and a static RAM.

13. The apparatus of claim 10, wherein the memory device is one of a plurality of memory devices and wherein the first interface interfaces each of the plurality of memory devices with the processing unit.

14. The apparatus of claim 10, wherein generating the first clock signal includes one of dividing or multiplying a frequency of the reference clock signal with the PLL circuit.

15. An apparatus comprising:
a processing unit including:
a first interface to couple the processing unit directly to a bidirectional data link coupled directly to a second interface of a memory device, the second interface including a clock source comprising a phase-locked loop (PLL) to generate a clock signal based on a reference clock signal provided to the memory device independent of the processing unit, the first interface to receive the clock signal from the second interface, the first interface including:

a first latch to perform, in response to the received clock signal, a first latching to exchange via the bidirectional data link first data read from the memory device; and a second latch to perform, in response to the received clock signal, a second latching to exchange via the bidirectional data link second data to be written to the memory device.

* * * * *